United States Patent [19]
Ono

[11] Patent Number: 5,780,896
[45] Date of Patent: Jul. 14, 1998

[54] SEMICONDUCTOR DEVICE HAVING SHALLOW IMPURITY REGION WITHOUT SHORT-CIRCUIT BETWEEN GATE ELECTRODE AND SOURCE AND DRAIN REGIONS AND PROCESS OF FABRICATION THEREOF

[75] Inventor: Atsuki Ono, Tokyo, Japan

[73] Assignee: NEC Corporation, Tokyo, Japan

[21] Appl. No.: 769,423

[22] Filed: Dec. 19, 1996

[30] Foreign Application Priority Data

Dec. 21, 1995 [JP] Japan ................................. 7-333177

[51] Int. Cl.$^6$ ..................... H01L 29/78; H01L 29/60
[52] U.S. Cl. ..................... 257/344; 257/382; 257/408; 257/410; 257/900
[58] Field of Search ..................... 257/408, 344, 257/900, 382, 385, 410, 411

[56] References Cited

U.S. PATENT DOCUMENTS

| 4,818,714 | 4/1989 | Haskell | 437/44 |
| 4,951,100 | 8/1990 | Parrillo | 257/382 |
| 5,182,619 | 1/1993 | Pfiester | 257/382 |
| 5,324,974 | 6/1994 | Liao | 257/344 |
| 5,521,411 | 5/1996 | Chen et al. | 257/344 |
| 5,670,804 | 9/1997 | Usagawa et al. | 257/279 |

FOREIGN PATENT DOCUMENTS

| 61-81664 | 4/1986 | Japan | 257/408 |
| 61-94371 | 5/1986 | Japan | 257/408 |
| 6-104276 | 4/1994 | Japan | 257/408 |

OTHER PUBLICATIONS

Kimura et al., "A 0.1 Micorm-gate Elevated Source and Drain MOSFET Fabricated By Phase-shifted Lithography", *Technical Digest of IEDM*, pp. 950–952, (1991) no month.

Primary Examiner—Donald Monin
Attorney, Agent, or Firm—Foley & Lardner

[57] ABSTRACT

Elevated source and drain regions epitaxially grown on both sides of a gate structure cause a dopant impurity to form an extremely shallow p-n junctions in a semiconductor substrate so as to prevent a field effect transistor from a short channel effect, and side wall spacers include pad layers of silicon nitride and spacer layers of silicon oxide formed on the pad layers so that the elevated source and drain regions form boundaries to the pad layers without a facet and a silicon layer on the spacer layers.

4 Claims, 4 Drawing Sheets

SEMICONDUCTOR DEVICE HAVING SHALLOW IMPURITY REGION WITHOUT SHORT-CIRCUIT BETWEEN GATE ELECTRODE AND SOURCE AND DRAIN REGIONS AND PROCESS OF FABRICATION THEREOF

FIELD OF THE INVENTION

This invention relates to a semiconductor device and, more particularly, to a structure of a semiconductor device having shallow impurity regions without short-circuit between a gate electrode and source and drain regions and a process of fabrication thereof.

DESCRIPTION OF THE RELATED ART

A semiconductor integrated circuit device is progressively increasing the circuit components integrated on a semiconductor chip, and, accordingly, the manufacturer makes research and development efforts to scale down the circuit components. A field effect transistor is an important circuit component, and the gate width or the channel length is shrunk to 0.1 micron or less. However, the punch-through phenomenon tends to take place between the source region and the drain region of the miniature field effect transistor, and the short-channel effect due to the punch-through phenomenon deteriorates device characteristics of the miniature field effect transistor such as a switching function and a power consumption.

It is known that shallow source and drain regions are effective against the short-channel effect. One of the approaches to form the shallow source and drain regions is disclosed by Kimura et. al. in "A 0.1 micron-gate Elevated Source and Drain MOSFET fabricated by Phase-shifted Lithography", Technical Digest of IEDM, 1991, pages 950 to 952. Kimura et. al. elevates the source and drain regions over the channel region by using a selective epitaxial technique. The elevated source and drain regions decreases the effective depth, and prevent the field effect transistor from the short-channel effect.

The elevated source and drain regions are formed as follows. FIG. 1 illustrates a field effect transistor with the elevated source and drain regions. Firstly, a gate structure 1 is formed on an active area defined by a thick field oxide layer 2 selectively grown on a semiconductor substrate 3, and epitaxial silicon layers 4a and 4b are grown over exposed areas on both sides of the gate structure 1. The gate structure 1 includes a thin gate insulating layer 1a on a channel region 1b, a gate electrode 1c of polysilicon formed on the thin gate insulating layer 1a and insulating side wall spacers 1d and 1e formed of silicon oxide on side surfaces of the gate electrode 1c. The epitaxial silicon layers 4a and 4b swell into eminences, and, accordingly, the top surfaces of the epitaxial silicon layers 4a/4b are higher than the channel region 1b.

A dopant impurity is ion implanted in a self-aligned manner with the gate structure 1, and converts the epitaxial silicon layers 4a/4b and extremely shallow surface portions 3a/3b of the semiconductor substrate 3 to the opposite conductivity type to the semiconductor substrate 3. The epitaxial silicon layers 4a/4b and the extremely shallow surface portions 3a/3b form a source region 5a and a drain region 5b, respectively. The projection range of the accelerated ion is partially consumed by the epitaxial silicon layers 4a and 4b, and, for this reason, the p-n junctions 4c and 4d of the source region 5a/drain region 5b are shallower than source/drain regions formed without the epitaxial silicon layers 4a and 4d. Thus, the epitaxial silicon layers 4a and 4b decrease the effective depth of the source region 5a and the drain region 5b with respect to the channel region 1b, and are expected to prevent the field effect transistor from the short-channel effect.

However, the prior art field effect transistor encounters a problem in that the short-channel effect still takes place. In detail, when the silicon layers 4a and 4b are epitaxially grown, the manufacturer selects the depositing conditions in such a manner as to deposit the silicon over the exposed silicon surfaces without a growth on the side wall spacers 1d and 1e. However, such a large selectivity results in facets 6a and 6b at the boundaries between the epitaxial silicon layers 4a/4b and the side wall spacers 1d/1e as shown in FIG. 2. The accelerated ion deeply penetrates through the facets 6a/6b into the semiconductor substrate 3, and the impurity profiles 4c'/4d' of the surface portions 3a'/3b' have inside sub-portions 4e' and 4f' under the side wall spacers 1d/1e. Even though the epitaxial silicon layers 4a/4b make the central sub-portions of the surface portions 3a'/3b' shallow, the facets 6a/6b decrease the effective thickness of the epitaxial silicon layers 4a/4b, and the inside sub-portions 4e' and 4f' become deep enough to allow the short-channel effect to take place.

On the other hand, if the depositing conditions are selected in such a manner as to make the selectivity small, the epitaxial silicon is grown on not only the exposed silicon areas but also the side wall spacers 1d/1e of silicon oxide, and undesirable short-circuit takes place between the gate electrode 1c and the source/drain regions 5a/5b. Thus, there is a trade-off between the prevention of the short-channel effect and the prevention of the short-circuit.

SUMMARY OF THE INVENTION

It is therefore an important object of the present invention to provide a field effect transistor which is prevented from not only the short-channel effect but also the short-circuit.

It is also an important object of the present invention to provide a process of fabricating the field effect transistor which prevents the boundaries between epitaxial layers and side wall spacers from facets without sacrifice of selectivity of the epitaxial growth.

The present inventor contemplated the problems inherent in the prior art field effect transistor. The present inventor noticed that a facet hardly took place in a boundary between insulating material and semiconductor material which has a small selectivity of epitaxial growth to the insulating material. If side wall spacers were formed partially of a kind of insulating material less selective to the epitaxial growth of the semiconductor material for preventing the boundary from the facet and partially of another kind of insulating material much selective to the epitaxial growth of the semiconductor material for preventing a short-circuit, the composite side wall spacers would prevent a field effect transistor from both of the short-channel effect and the short-circuit.

To accomplish the object, the present invention proposes to use side wall spacers partially formed of a kind of insulating material having a small selectivity of epitaxial growth to a semiconductor material and partially formed of another kind of insulating material having a large selectivity of epitaxial growth to the semiconductor material. The typical example of the insulating material available for the side wall spacers were silicon nitride and silicon oxide.

In accordance with one aspect of the present invention, there is provided a semiconductor device having a field effect transistor formed on a semiconductor base layer, the field effect transistor comprising: a gate insulating layer formed on a first area of the semiconductor base layer; a gate electrode formed on the gate insulating layer; side wall spacers formed on second areas of the semiconductor base layer on both sides of the first area, and held in contact with side surfaces of the gate electrode, the side wall spacers including pad layers formed of a first insulating material and respectively having first bottom surfaces respectively held in contact with the second areas, first upper surfaces and first side surfaces, and spacing layers formed of a second insulating material and respectively having second bottom surfaces respectively held in contact with the first upper surfaces of the pad layers; and source and drain regions including conductive layers formed of a semiconductor material epitaxially grown on third areas on opposite sides of the second areas to the first area and having second side surfaces respectively held in contact with the first side surfaces, the semiconductor material having a small selectivity of epitaxial growth to the first insulating material and a large selectivity of epitaxial growth to the second insulating material, and impurity portions of the semiconductor base layer respectively providing the third areas overlain by the conductive layers and opposed to each other through the first area.

In accordance with another aspect of the present invention, there is a process of fabricating a semiconductor device having a field effect transistor, comprising the steps of: a) preparing a semiconductor base layer; b) forming a gate insulating layer on a first area of the semiconductor base layer; c) forming a gate electrode on the gate insulating layer; d) forming side wall spacers held in contact with side surfaces of the gate electrode, side surfaces of the gate insulating layer and second areas of the semiconductor base layer on both sides of the first area, each of the side wall spacers including a pad layer of a first insulating material held in contact with one of the second areas and a spacer layer of a second insulating material formed on the pad layer; e) epitaxially growing a semiconductor material on at least third areas of the semiconductor base layer on the opposite sides of the second areas to the first area for forming semiconductor layers on the third areas, the epitaxial growth of the semiconductor material being carried out under conditions imparting a small selectivity between the semiconductor material and the first insulating material for forming the semiconductor layers without a facet in boundaries to the pad layers and a large selectivity between the semiconductor material and the second insulating material for preventing the spacer layers from a deposition of the semiconductor material; and f) introducing a dopant impurity through the semiconductor layers into a shallow surface portions of the semiconductor base layer.

BRIEF DESCRIPTION OF THE DRAWINGS

The features and advantages of the semiconductor device and the process according to the present invention will be more clearly understood from the following description taken in conjunction with the accompanying drawings in which.

DESCRIPTION OF THE PREFERRED EMBODIMENT

Figure 1:
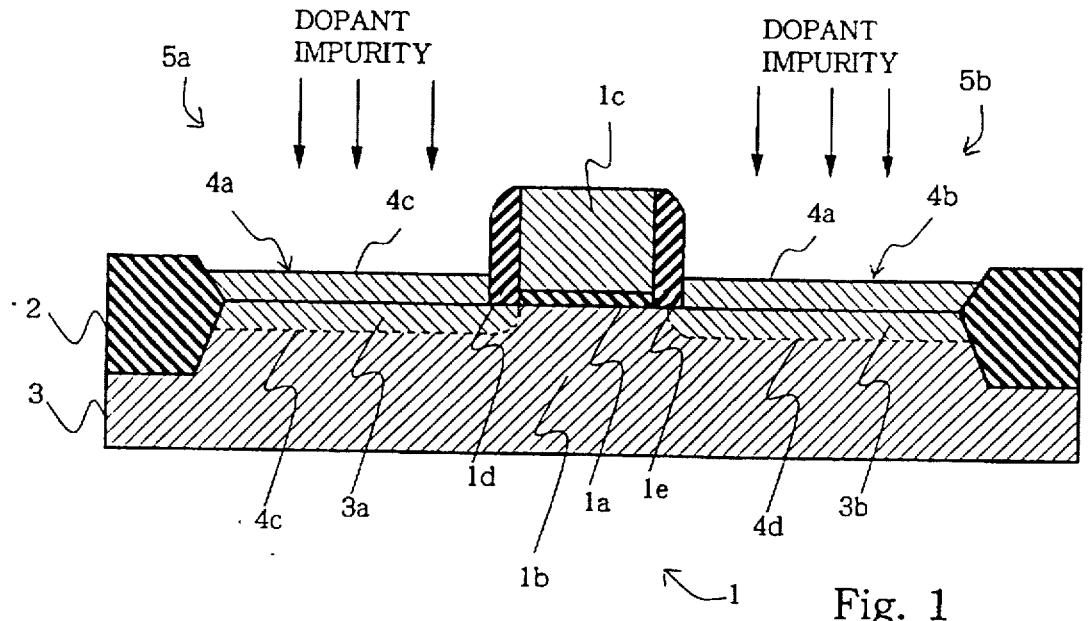
FIG. 1 is a cross sectional view showing the ion-implantation in the process of fabricating the prior art field effect transistor.
Figure 2:
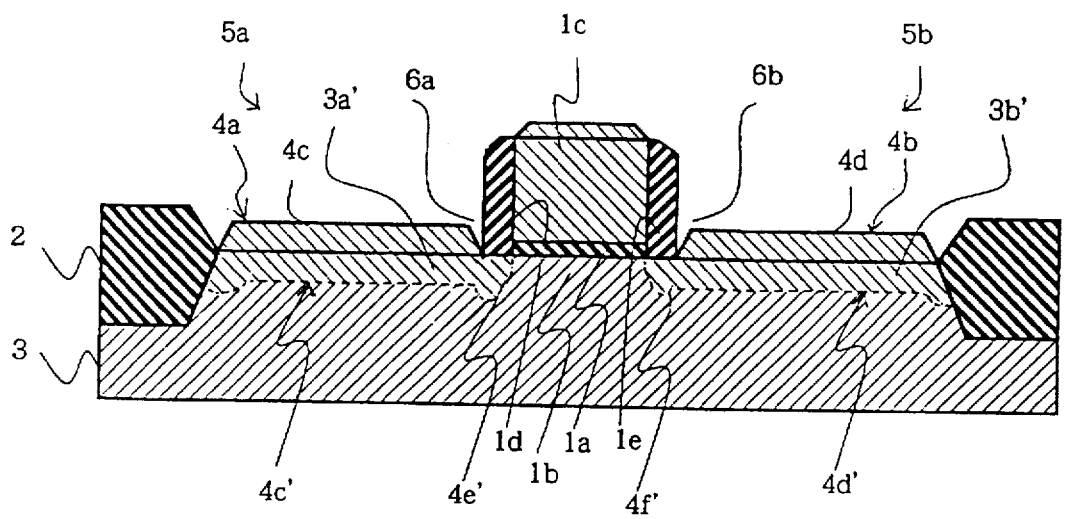
FIG. 2 is a cross sectional view showing the facets produced at the boundaries of the epitaxial silicon layers and the side wall spacers.

A process of fabricating a field effect transistor embodying the present invention starts with preparation of a semiconductor substrate 10, and a well 10a is formed in the surface portion of the semiconductor substrate 10. If the field effect transistor to be fabricated is an n-channel type, the well 10a is doped with p-type dopant impurity, and the semiconductor substrate 10 is opposite in conductivity type to the well 10a. On the other hand, when a p-channel type field effect transistor is fabricated, a p-type semiconductor substrate 10 is prepared, and an n-type dopant impurity is introduced in the surface portion of the p-type semiconductor substrate 10. The dopant impurity is introduced into the surface portion of the semiconductor substrate 10 by using an ion-implantation or a thermal diffusion, by way of example.

A thick field oxide layer 10b is selectively grown in the well 10b, and define an active area 10c assigned to the field effect transistor. The active area is exposed to an oxidizing ambience, and a surface portion of the well 10a is thermally oxidized so as to cover the active area 10c with a thin oxide layer. In this instance, the thin oxide layer is 5 to 6 nanometers thick.

Subsequently, non-doped polysilicon is deposited to 200 nanometers thick by using a chemical vapor deposition, by way of example, and a non-doped polysilicon layer is laminated on the thin oxide layer. In this instance, the non-doped polysilicon layer is of the order of 200 nanometers thick.

Photo-resist solution is spun onto the non-doped polysilicon layer, and is baked so as to cover the non-doped polysilicon layer with a photo-resist layer (not shown). A pattern image for a gate electrode is optically transferred from a reticle (not shown) to the photo-resist layer, and a latent image is formed in the photo-resist layer. The latent image is developed in developing solution, and the photo-resist layer is formed into a photo-resist etching mask (not shown).

Figure 3A:
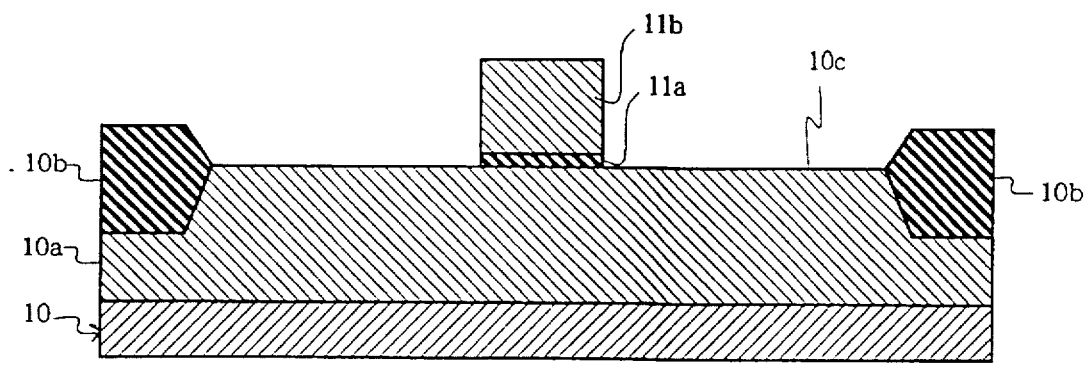
FIGS. 3A to 3F are cross sectional views showing a process sequence for fabricating a field effect transistor according to the present invention.

The photo-resist etching mask exposes the non-doped polysilicon layer and the thin oxide layer on both sides thereof to etchant, and the non-doped polysilicon layer and the thin oxide layer are patterned into a gate oxide layer 11a and a non-doped polysilicon gate 11b as shown in FIG. 3A. The process sequence until the patterning stage is similar to that of the prior art process. The sub-area beneath the gate oxide layer 11a serves as a channel region, and is corresponding to the first area.

Subsequently, silicon nitride is deposited over the entire surface of the resultant structure shown in FIG. 3A, and the resultant structure is covered with a silicon nitride layer 12a. A thermal chemical vapor deposition or a low pressure chemical vapor deposition is available for the silicon nitride layer 12a. The silicon nitride layer 12a is as thick as epitaxial silicon layers grown in a later stage, and is 30 to 50 nanometers thick in this instance. Silicon oxide is deposited to 50 nanometers thick over the silicon nitride layer 12a by using a thermal chemical vapor deposition, and a silicon oxide layer 12b is laminated on the silicon nitride layer 12a as shown in FIG. 3B.

Figure 3B:
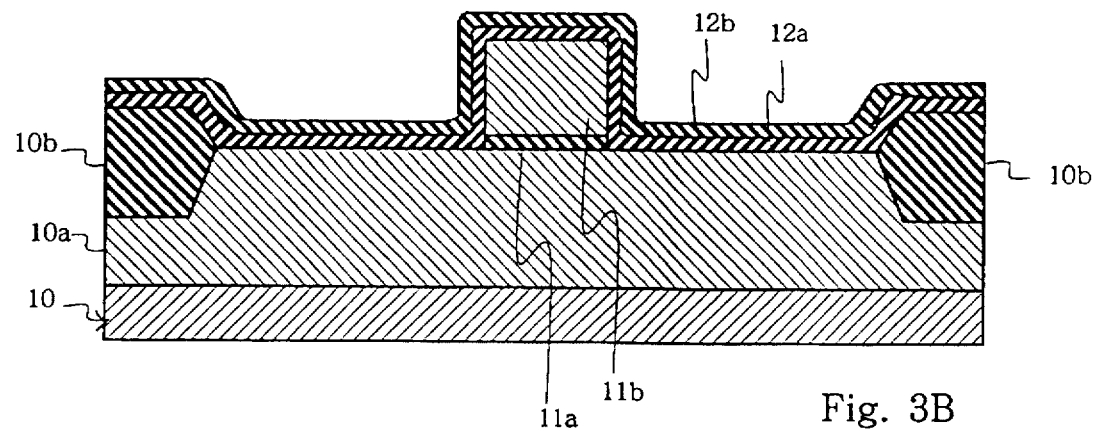

The resultant structure shown in FIG. 3B is placed in a reaction chamber of a reactive ion etching system (not shown), and the silicon oxide layer 12b and the silicon nitride layer 12a are subjected to an anisotropic ion etching. The anisotropic ion etching vertically proceeds, and the silicon oxide layer 12b and the silicon nitride layer 12a are partially etched away so as to form side wall spacers 11c/11d.

The side wall spacers 11c/11d have pad layers 11e/11f of silicon nitride and spacer layers 11g/11h of silicon oxide 11g/11h. The pad layers 11e/11f have a cross section shaped into an L-letter configuration. The bottom surfaces of the pad layers 11e/11f are held in contact with the well 10a on both sides of the channel region, and the vertical inner surfaces of the pad layers 11e/11f are held in contact with the side surfaces of the gate oxide layer 11a and the side surfaces of the non-doped polysilicon gate electrode 11b. The areas on both sides of the channel region serve as the second areas.

Figure 3C:
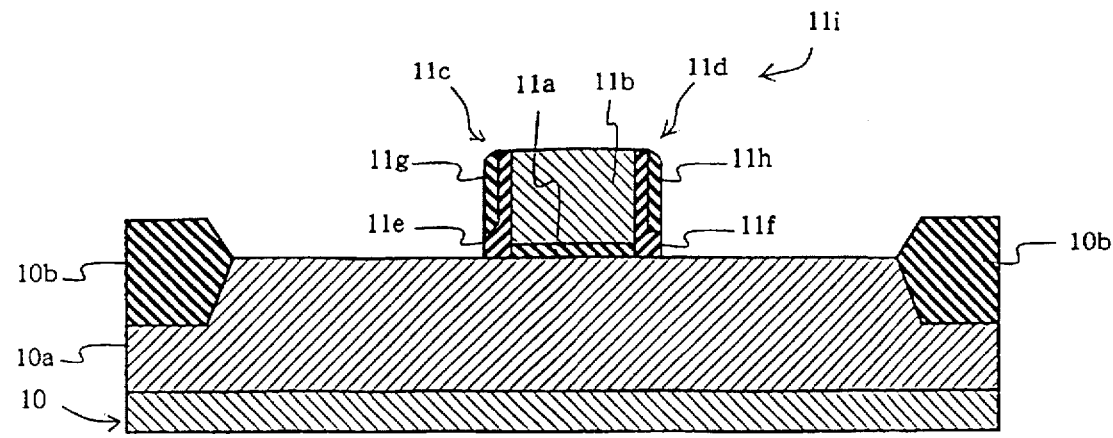
Figure 3D:
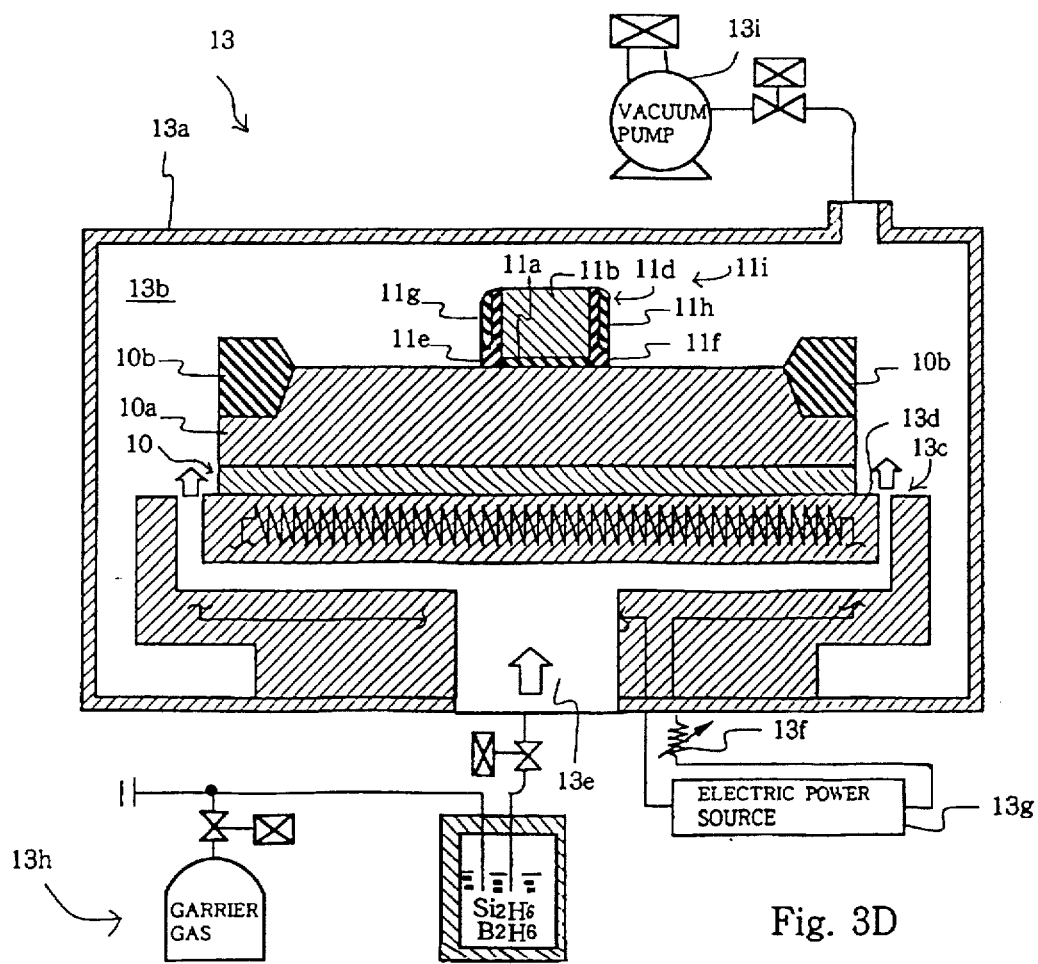

The spacer layers 11g/11h are formed on the pad layers 11e/11f, and the vertical inner surfaces of the spacer layers 11g/11h are held in contact with the vertical outer surfaces of the pad layers 11e/11f, respectively. The gate oxide layer 11a, the non-doped polysilicon gate electrode 11b and the side wall spacers 11c/11d form in combination a gate structure 11i. The resultant structure of this stage is illustrated in FIG. 3C.

Subsequently, the resultant structure is placed in a reactor 13a of a chemical vapor deposition system 13, and the surfaces of the well 10a are undesirably covered with thin natural oxide films (not shown) before the entry into the reactor 13a. The reactor 13a defines a reaction chamber 13b, and a suceptor 13c is provided in the reaction chamber 13b. The semiconductor substrate 10 is placed on the suceptor 13c. The suceptor 13c has a heater 13d and a gas conduit 13e. The heater 13d is connected through a variable resistor 13f to an electric power source 13g, and the variable resistor 13f is used for changing the temperature around the semiconductor substrate 10. On the other hand, the gas conduit 13e is connected to a gas supply sub-system 13h, and the gas supply sub-system 13h supplies gaseous mixture of $Si_2H_6$ and $B_2H_6$ through the gas conduit 13e to the reaction chamber 13b. The reaction chamber 13b is further connected to a vacuum pump 13i, and the vacuum pump 13i develops vacuum in the reaction chamber 13b.

First, the vacuum pump 13i creates vacuum equal to or less than $10^{-9}$ torr in the reaction chamber 13b, and the heater 13d heats the semiconductor substrate 10 between 800 degrees and 900 degrees in centigrade. The natural oxide films are removed from the surfaces of the well 10a.

Figure 3E:
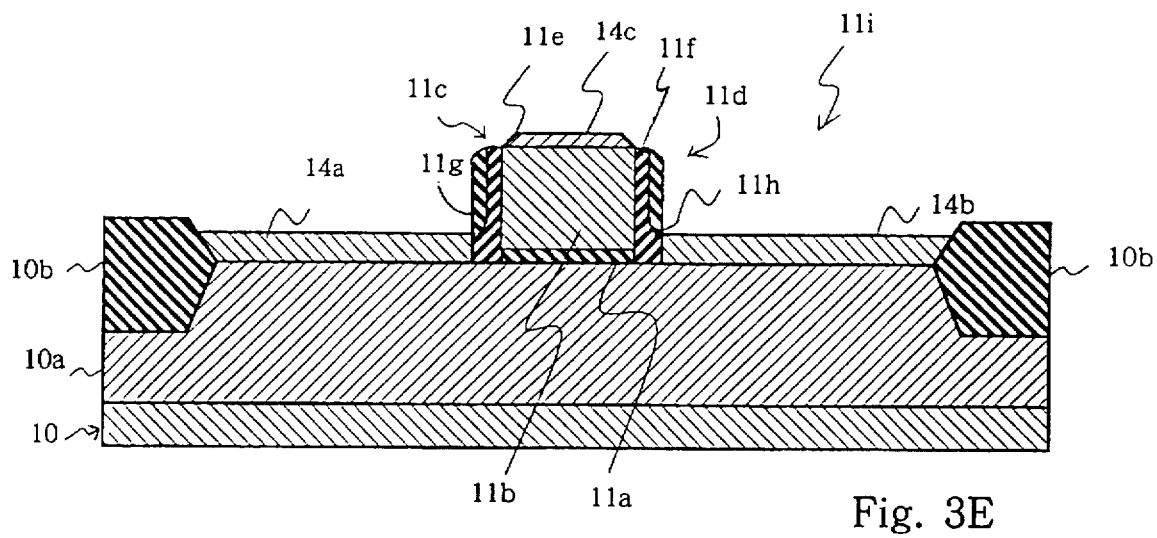

Subsequently, the temperature of the semiconductor substrate 10 is decreased to 600 degrees to 650 degrees in centigrade, and the gaseous mixture of $Si_2H_6$ and $B_2H_6$ is introduced into the reaction chamber 13b. Then, silicon is epitaxially grown on the surfaces of the well 10a and the top surface of the non-doped polysilicon gate electrode 11b, and the surfaces of the well 10a and the top surface of the non-doped polysilicon gate electrode 11b are covered with silicon layers 14a, 14b and 14c as shown in FIG. 3E. The silicon layers 14a and 14b is as thick as the pad layers 11e/11f, and the thickness of the silicon layers 14a and 14b ranges from 30 nanometers to 50 nanometers in this instance.

Although the surfaces of the well 10a and the top surface of the non-doped polysilicon gate electrode 11b are covered with the silicon layers 14a to 14c, the spacer layers 11g and 11h are not covered with a silicon layer, because the silicon has a large selectivity to the silicon oxide under the aforementioned depositing conditions. For this reason, the non-doped polysilicon gate electrode 11b is never short-circuited to a source region and a drain region.

On the other hand, the silicon has a small selectivity to the silicon nitride under the aforementioned depositing conditions, and a facet does not take place in the boundaries between the pad layers 11e/11f and the silicon layers 14a/14b. For this reason, the silicon layers 14a/14b uniformly keeps the effective thickness over the surfaces of the well 10a. The surfaces of the well 10b serve as the third areas on the opposite sides of the second areas to the first area.

Subsequently, dopant impurity is ion implanted through the silicon layers 14a to 14c into surface portions 10d and 10e of the well 10a. If the field effect transistor to be fabricated requires an n-type conductive channel, arsenic is ion implanted at dose of $3\times10^{15}$ cm$^{-2}$ under the acceleration energy of 50 keV. On the other hand, if the field effect transistor requires a p-type conductive channel, $BF_2$ is ion implanted at dose of $3\times10^{15}$ cm$^{-2}$ under the acceleration energy of 70 keV. Not only the silicon layers 14a to 14c but also the surface portions 10d/10e and the polysilicon gate electrode 11b are doped with the dopant impurity, and the dopant impurity is diffused into the surface portions beneath the side wall spacers 11c/11d during a lamp annealing at 1000 degrees in centigrade for 10 seconds.

Figure 3F:
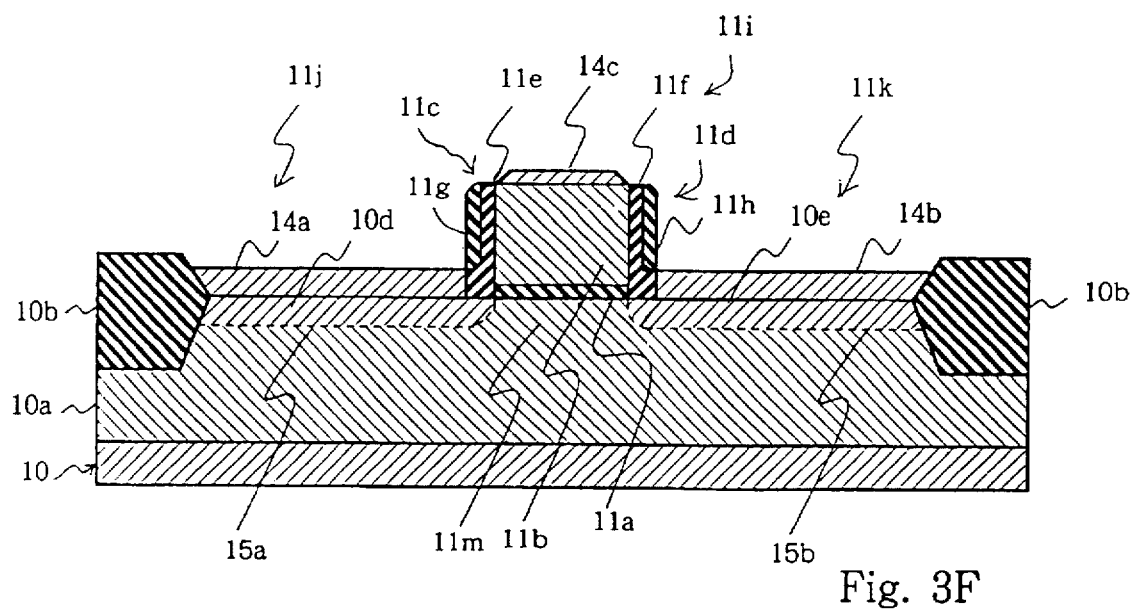

The silicon layers 14a and 14b of the uniform thickness consumes the projection range of the ion-implanted dopant impurity, and causes p-n junctions 15a and 15b to extend substantially in parallel to the major surface of the semiconductor substrate 10 as shown in FIG. 3F. In other words, the surface portions 15a/15b are so shallow without a partially deep portion that the short-channel effect is hardly take place.

The silicon layers 14a/14b and the surface portions 10d/10e serve as a source region 11j and a drain region 11k, and the gate structure 11i, the source and drain regions 11j/11k and a channel region 11m between the surface portions 10d/10e as a whole constitute the field effect transistor.

Though not shown in the drawings, the resultant structure shown in FIG. 3F is covered with an inter-level insulating layer, and through-holes are formed in the inter-level insulating layer so as to provide electrical connections between the field effect transistor and upper wirings on the inter-level insulating layer.

As will be appreciated from the foregoing description, two kinds of insulating material prevent the field effect transistor from the short-circuit and the short-channel effect by virtue of the different selectivity of epitaxial growth of silicon, and the field effect transistor is improved in reliability.

Although a particular embodiment of the present invention has been shown and described, it will be obvious to those skilled in the art that various changes and modifications may be made without departing from the spirit and scope of the present invention.

For example, the two kinds of insulating material are not limited to the silicon oxide and the silicon nitride. Any two kinds of insulating material are available for the side wall spacers in so far as an epitaxial semiconductor material has a selectivity therebetween.

The field effect transistor according to the present invention may form an integrated circuit together with other circuit component elements such as a capacitor and resistor.

The field effect transistor according to the present invention may be a thin film transistor.

The gate electrode may have a polyside structure or a refractory metal silicide structure. In this instance, the dopant impurity is only introduced through the silicon layers 14a/14b into shallow surface portions 10d/10e.

Any two kinds of insulating material are available for the side wall spacers 11c/11d in so far as an epitaxial growth of semiconductor material achieve different selectivity therebetween.

In the above described embodiment, the gaseous mixture of $Si_2H_6$ and $B_2H_6$ is used for the selective growth of silicon. However, the gaseous mixture introduces boron into the silicon. The boron is not problem in the p-channel type field effect transistor. However, if a field effect transistor hates the boron, $Si_2H_6$ is used for the selective growth.

What is claimed is:

1. A semiconductor device having a field effect transistor formed on a semiconductor base layer, said field effect transistor comprising:

a gate insulating layer formed on a first area of said semiconductor base layer;

a gate electrode formed on said gate insulating layer;

side wall spacers formed on second areas of said semiconductor base layer on both sides of said first area, and held in contact with side surfaces of said gate electrode, said side wall spacers including pad layers formed of a first insulating material and respectively having first bottom surfaces respectively held in contact with said second areas, first upper surfaces and first side surfaces, and spacing layers formed of a second insulating material and respectively having second bottom surfaces respectively held in contact with said first upper surfaces of said pad layers; and source and drain regions including conductive layers formed of a semiconductor material epitaxially grown on third areas on opposite sides of said second areas to said first area and having second side surfaces respectively held in contact with said first side surfaces, said semiconductor material having a small selectivity of epitaxial growth to said first insulating material and a large selectivity of epitaxial growth to said second insulating material, and impurity portions of said semiconductor base layer respectively providing said third areas overlain by said conductive layers and opposed to each other through said first area.

2. The semiconductor device as set forth in claim 1, in which said semiconductor material, said first insulating material and said second insulating material are silicon, silicon nitride and silicon oxide, respectively.

3. The semiconductor device as set forth in claim 1, in which said first side surfaces have a height from said second areas approximately equal to a height of said second side surfaces from said third areas.

4. The semiconductor device as set forth in claim 3, in which said height of said first side surfaces and said height of said second side surfaces range between 30 nanometers to 50 nanometers.

* * * * *